United States Patent [19]

Mitchell

[11] 4,072,915
[45] Feb. 7, 1978

[54] ACOUSTIC SURFACE WAVE DEVICES

[75] Inventor: Richard F. Mitchell, Merstham, England

[73] Assignee: U.S. Philips Corporation, New York, N.Y.

[21] Appl. No.: 721,967

[22] Filed: Sept. 10, 1976

[30] Foreign Application Priority Data

Sept. 19, 1975 United Kingdom ............... 38577/75

[51] Int. Cl.² ........................ H03H 9/04; H03H 9/26; H03H 9/32; H01L 41/04
[52] U.S. Cl. ..................................... 333/72; 310/313; 310/366
[58] Field of Search .......................... 333/30 R, 72, 71; 310/8, 8.1, 8.2, 9.8; 331/107 A; 330/5.5

[56] References Cited

U.S. PATENT DOCUMENTS

| 3,716,809 | 2/1973 | Reeder et al. | 333/30 R |
| 3,886,504 | 5/1975 | Hartmann et al. | 333/72 |
| 3,961,293 | 6/1976 | Hartmann et al. | 310/9.8 |
| 3,970,970 | 7/1976 | Worley | 333/72 |

Primary Examiner—Alfred E. Smith
Assistant Examiner—Marvin Nussbaum
Attorney, Agent, or Firm—Frank R. Trifari; Bernard Franzblau

[57] ABSTRACT

An electrode structure within the cavity of an acoustic surface wave resonator, e.g. an interdigital transducer or a multistrip coupler, has two sections separated by an odd integral multiple of a quarter wavelength of the standing wave in the cavity and located with respect to the center of the cavity so that all the electrodes are midway between a node and an adjacent antinode of the standing wave. Distortion of the resonator response due to reflection by the electrodes of the transducer or coupler is suppressed by this arrangement.

14 Claims, 4 Drawing Figures

ACOUSTIC SURFACE WAVE DEVICES

This invention relates to acoustic surface wave devices including acoustic surface wave resonators, and more particularly to electrical filters including coupled acoustic surface wave resonators.

Figure 1:
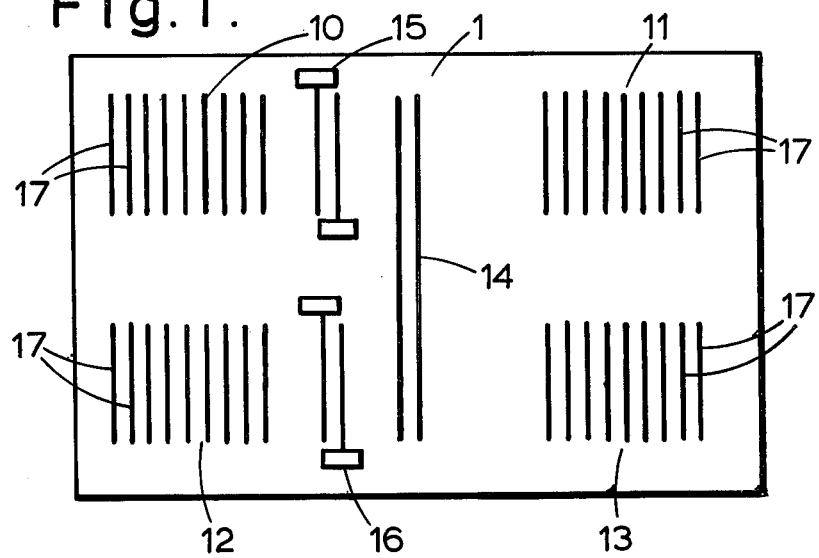
Figure 2:
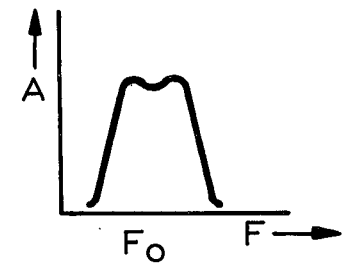

FIGS. 1 and 2 of the accompanying drawings show respectively a schematic plan view of an electrical filter including coupled acoustic surface wave resonators and the band-pass amplitude-frequency response of that filter. This electrical filter is described in our U.S. patent application Ser. No. 648,308 (filed Jan. 12, 1976) and also it is known from the article "Coupled-Resonator Acoustic Surface Wave Filter" by R. F. Mitchell et al in Electronics Letters, 12th June 1975, Vol. 11, No. 12, pages 253–4.

Referring now to FIG. 1, there is shown a body 1 of piezoelectric material capable of propagating and supporting acoustic surface waves, e.g. Y cut Z propagating lithium niobate, on the upper surface of which is formed a first acoustic surface wave resonator comprising two reflectors 10 and 11; a second, similar acoustic surface wave resonator comprising two reflectors 12 and 13; an array 14 of discrete parallel conducting strips electrically insulated from each other which electrically couples the two resonators; and input transducer 15 and an output transducer 16.

The distance between the two reflectors 10 and 11 of the first resonator is chosen so that they form a cavity capable of supporting a resonant acoustic surface standing wave in the cavity at a frequency $f_o$ when acoustic surface wave energy is launched into the cavity between the two reflectors 10 and 11 by the input transducer 15 at the frequency $f_o$. The length of the cavity will be substantially an integral number of half wavelengths of acoustic surface waves at the frequency $f_o$.

Each of the reflectors 10 and 11 is constituted by an array of discrete reflecting elements 17 arranged one behind the other. The reflecting elements 17 may be, for example, grooves in or conducting strips on the surface of the body 1. The reflecting elements 17 are preferably periodically arranged as a grating with the centre-to-centre spacing between the reflecting elements 17 essentially half a wavelength $\lambda/2$ or an integral number of half wavelengths at the frequency $f_o$, and the number of reflecting elements 17 in each reflector 10 and 11 is chosen to give a high reflection coefficient of acoustic surface wave energy from each reflector 10 and 11. The low losses associated with this reflection coefficient result in the resonator having a high Q factor, where $Q = f_o/\Delta f$, $\Delta f$ being the 3db bandwidth of the resonator at the frequency $f_o$. The second resonator formed by the reflectors 12 and 13 is similar to the first resonator formed by the reflectors 10 and 11 just described.

The array 14 of discrete parallel conducting strips electrically insulated from each other is located in the first and second resonator cavities and extends between them. Part of the energy of the acoustic surface standing wave across the array 14 in the first resonator formed by the reflectors 10 and 11 is transferred as electrical energy by the strips of the array 14 to be relaunched as acoustic surface wave energy in the second resonator formed by the reflectors 12 and 13. An acoustic surface standing wave is thereby set up in the second resonator at the frequency fo and acoustic surface wave energy in this standing wave is received by the output transducer 16. The centre-to-centre spacing of the strips of the array 14 can be $\lambda/2$ at the frequency $f_o$.

The input and output transducers 15 and 16 are designed so that they will respectively launch or receive acoustic surface wave energy at the frequency $f_o$. They can each be constituted by a single interdigital transducer having fingers whose centre-to-centre spacing is $\lambda/2$ at the frequency $f_o$.

With an electrical input signal applied to the terminals of the input transducer 15 and electrical output taken from the terminals of the output transducer 16, the device described above with reference to FIG. 1 functions as an electrical filter of the known type including two resonators tuned to the same frequency $f_o$ and coupled so that the combined response has a double-resonance band-pass characteristic of amplitude A against frequency $f$ centred on the frequency $f_o$. This characteristic is shown in FIG. 2. As is known, to obtain a filter of this type with a square band-pass characteristic, i.e. with a flat top and a sharp cut-off, a well-defined degree of coupling is required between the two resonators which must each have a high Q factor, where $Q = f_o/\Delta f$, $\Delta f$ being the 3db bandwidth of each resonator at the frequency $f_o$. In the device described above with reference to FIG. 1 the degree of coupling between the two resonators is essentially well-defined by the choice of the number of strips in the coupling array 14, and the two resonators each have a high Q factor which is essentially due to the high reflection coefficient of the reflectors as has been explained.

A problem which arises with each of the resonators of the above-described known filter will not be discussed.

For each of the resonators shown in FIG. 1, the array 14 and the interdigital transducers 15 or 16 respectively can each be described as means for coupling with acoustic surface wave standing wave energy in the respective resonator. In each case this coupling means consists of or includes parallel conductive strips transverse to the length of the respective cavity and located between the respective pair of reflectors, the strips of the array having a regular centre-to-centre spacing which is thus half a wavelength of acoustic surface waves at a predetermined frequency. If this predetermined frequency is the same as the frequency $f_o$ of an acoustic surface standing wave in the resonator, then each of the strips of the array will have the same position with respect to the nodes and antinodes of that acoustic surface standing wave and so will couple with equal strength to that acoustic surface standing wave. In both types of coupling means the strips of the array partially reflect acoustic surface waves, and additionally in the case of the interdigital transducer the acoustic surface waves cause currents to circulate along the connecting bus bars to the electrode strips which thus re-radiate acoustic surface waves. These reflections and re-radiations, which can both be called "interactions", will be additive in phase at the frequency for which the centre-to-centre spacing of the strips of the array is half a wavelength to produce unwanted acoustic surface wave energy. Although the array 14 and the interdigital transducers 15 and 16 are each shown in FIG. 1 as having an array with only two conductive strips, the number of conductive strips will be sufficiently large to obtain the required degree of coupling with the resonant acoustic surface standing wave set up by multiple reflections in the cavity formed by the two reflectors 10, 11 and 12, 13 respectively for each cavity. This required number of conductive strips in the array 14 or the transducer 15 or 16 may result in unwanted acoustic surface wave energy of significant amplitude due to "interactions". An array 14 or a transducer 15 or 16 which produces this unwanted acoustic surface wave energy of significant amplitude may form a resonant cavity with either of the reflectors 10, 11 or 12, 13 in the respective resonator and thus produce unwanted acoustic surface standing waves. It has been found experimentally that there are distortions in the ideal response of resonators such as those described with respect to FIGS. 1 and 2 which are attributable to this unwanted acoustic surface wave energy due to "interactions".

An object of the invention is to provide an acoustic surface wave device having an acoustic surface wave resonator and means for coupling with acoustic standing wave energy in the resonator in which the above described problem of unwanted acoustic surface wave energy due to "interactions" in the coupling means is substantially overcome.

According to the invention there is provided an acoustic surface wave device having an acoustic surface wave resonator which includes a pair of reflectors forming a resonant cavity capable of supporting an acoustic surface standing wave at or near a predetermined frequency, the device furthermore having means for coupling with acoustic surface standing wave energy in the resonator, the coupling means including two similar arrays of parallel conductive strips transverse to the length of the cavity and between the pair of reflectors, the strips of each array having a centre-to-centre spacing of half a wavelength or an odd integral multiple of half a wavelength of acoustic surface waves at said predetermined frequency, the spacing between the two arrays being a quarter wavelength or an odd integral multiple of a quarter wavelength of acoustic surface waves at said predetermined frequency, and the point midway between the two arrays being at the centre of the resonant cavity or displaced from the centre of the resonant cavity by half a wavelength or an integral multiple of a half a wavelength of acoustic surface waves at said predetermined frequency.

In an acoustic surface wave device as described in the above paragraph, an interdigital transducer within the cavity can include said coupling means.

According to one feature of the invention, there is provided an electrical filter including two acoustic surface wave devices as described in the above paragraph, in which said interdigital transducer in one of the devices forms input transducing means arranged to launch acoustic surface wave energy into the resonator of that device which forms an acoustic surface standing wave therein, in which means are provided for coupling the resonators of the two devices whereby an acoustic surface standing wave is formed in the resonator of the other device, and in which said interdigital transducer in the other device forms output transducing means arranged to receive acoustic surface wave energy from the resonator of the other device. In a filter as just described the means for coupling the resonators of the two devices can be electrical coupling means consisting of first and second arrays of discrete parallel conducting strips electrically insulated from each other, the first and second arrays of discrete strips being located in the resonator of the one and the other device respectively and being arranged for the transfer of electrical energy from the first array of discrete strips to the second array of discrete strips, whereby part of the acoustic surface wave energy across the first array of discrete strips in the resonator of the one device is transferred to be re-launched as acoustic surface wave energy by the second array of discrete strips in the resonator of the other device.

The first and second arrays of discrete strips can be formed as a single array.

According to another feature of the invention there is provided an electrical filter including two acoustic surface wave devices as decribed in the last paragraph but three, in which input transducing means are arranged to launch acoustic surface wave energy into the resonator of one of the devices which forms an acoustic surface standing wave therein, in which electrical means are provided for coupling the resonators of the two devices whereby an acoustic surface standing wave is formed in the resonator of the other device, said electrical means including said coupling means in each device, said two similar arrays of conductive strips in one device being arranged with said two similar arrays of conductive strips in the other device for the transfer of electrical energy from the one to the other device thereby part of the acoustic surface wave energy across the coupling means in the one device is transferred to be re-launched as acoustic surface wave energy by the coupling means in the other device, and in which output transducing means are arranged to receive acoustic surface wave energy from the resonator of the other device. In a filter as just described, each of the two similar arrays in the one device can be formed as a single array with a corresponding one of the two similar arrays in the other device.

Each of the pair of reflectors in the device according to the invention, or in both devices of the filter according to the one or the other feature of the invention, are preferably constituted by an array of discrete reflecting elements arranged one behind the other.

Figure 3:
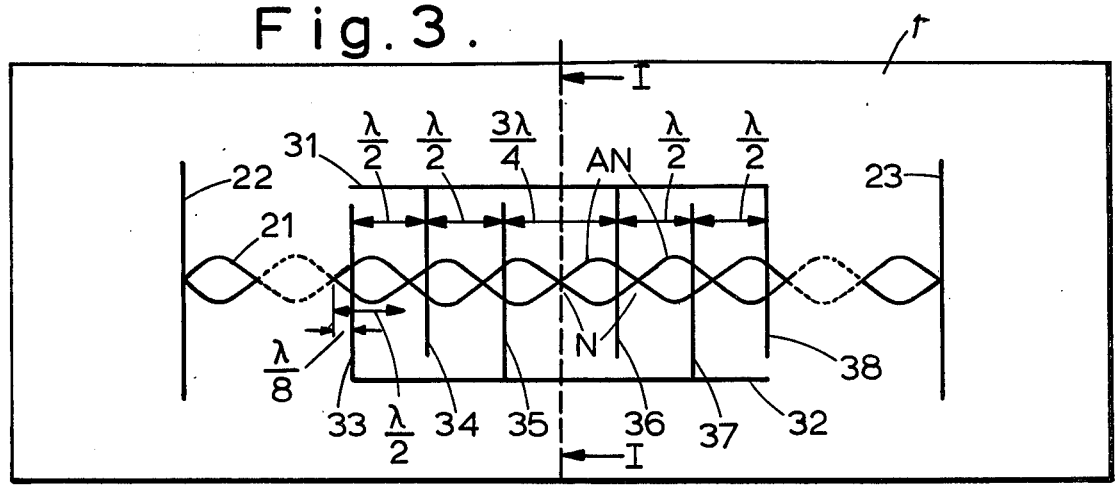
Figure 4:
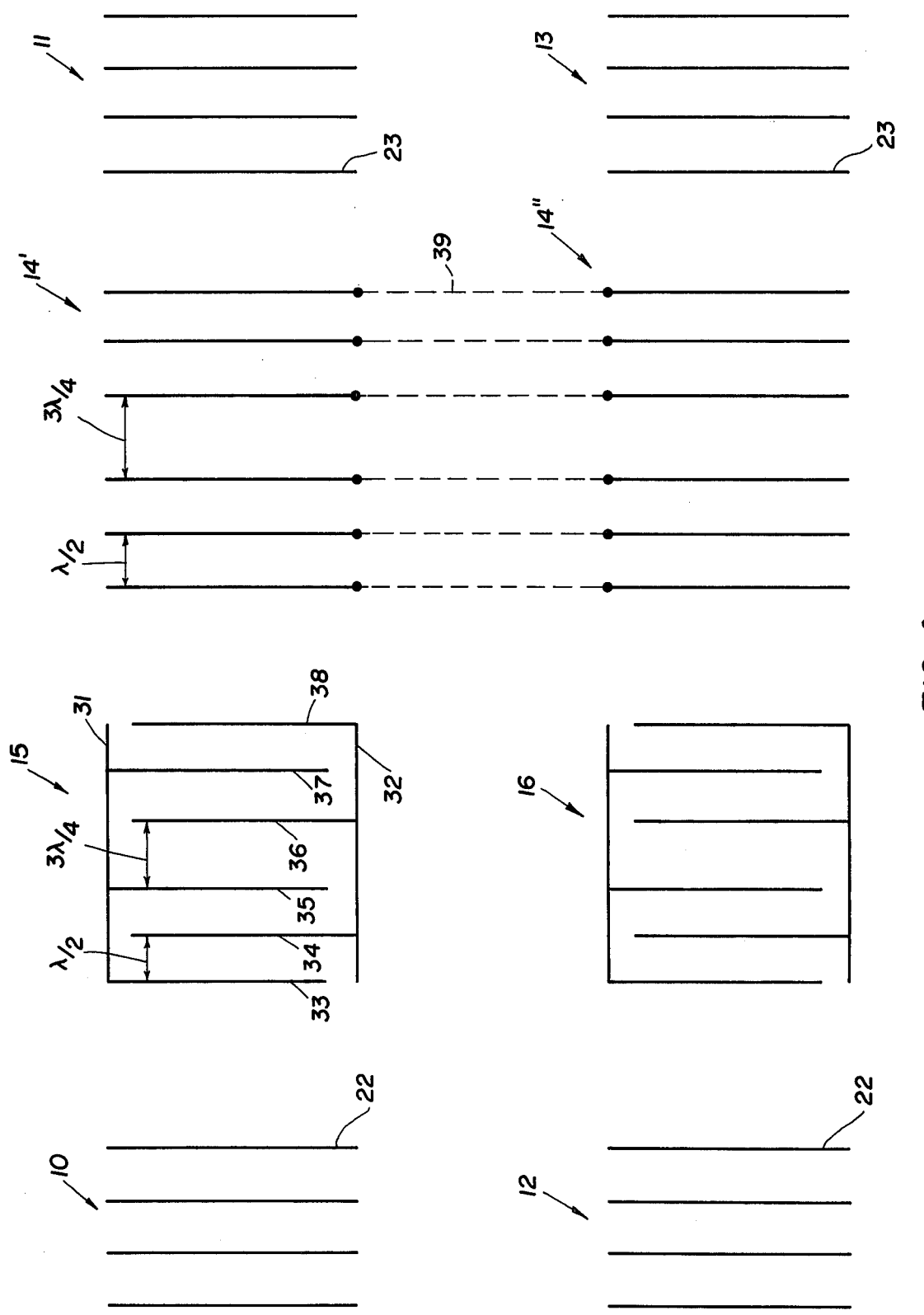

The invention will now be explained in more detail with reference to FIGS. 1 and 2, together with FIGS. 3 and 4 of the accompanying drawings. FIG. 3 shows an acoustic surface standing wave pattern in a resonant cavity and an interdigital transducer constructed and positioned in the resonant cavity according to the invention. FIG. 4 shows a multiresonator device in accordance with the invention.

FIG. 4 shows a multiresonator device in accordance with the invention.

Referring now to FIG. 3, an acoustic surface standing wave 21 is shown having antinodes AN (maxima of acoustic intensity) and nodes N (minima of acoustic intensity), with each antinode AN and its adjacent node N being spaced by a quarter wavelength $\lambda/4$ of acoustic surface waves at the frequency $f_o$ of the standing wave. The ends 22, 23 of the resonant cavity formed by a pair of reflectors such as the reflectors 10, 11 shown in FIG. 1 and containing the acoustic surface standing wave are spaced apart by an integral number of half wavelengths $n\ \lambda/2$ of the standing wave. As shown in FIG. 3 the length of the cavity is an even number of half wavelengths so that a node N is present at the centre of the cavity shown by the line I—I.

An interdigital transducer within the cavity includes two bus bars 31 and 32, a first array of parallel conductive strips 33, 34 and 35 transverse to the length of the cavity, and a second similar array of parallel conductive strips 36, 37 and 38 transverse to the length of the cavity. The strips 34, 36 and 38 are connected to the bus bar 31, and the strips 33, 35 and 37 are connected to the bus bar 32. The strips 33 to 38 will all have a finite width, for example $\lambda/4$ at the frequency $f_o$, and the thin lines showing these strips in FIG. 3 are positioned at their effective centres. The strips 33, 34, 35 of the first array have a regular centre-to-centre spacing of half a wavelength $\lambda/2$ at the frequency $f_o$, and the strips 36, 37, 38 of the second array have the same regular spacing. The spacing between the two arrays, that is to say the distance along the length of the cavity between the strip 35 and the strip 36, is three quarters of a wavelength $3\lambda/4$ at the frequency $f_o$ and the point mid way between the two arrays, that is to say the point mid way between the strips 35 and 36 is at the centre I—I of the cavity. With this arrangement of the strips 33 to 38, they all have their effective centres mid way between a node N and an adjacent antinode AN of the acoustic surface standing wave 21, that is to say they are all an eighth of a wavelength $\lambda/8$ at the frequency $f_o$ from a node N, and so they all couple to the standing wave 21 with equal strength. This equal strength coupling of all the electrodes 33 to 38 is desirable for the efficient operation of the interdigital transducer in its required function in the cavity as an input transducer or an output transducer, for example as the transducer 15 or the transducer 16 shown in FIG. 1.

The standing wave 21 consists of multiply reflected acoustic surface waves travelling between the ends 22, 23 of the cavity and these surface waves are also partially reflected by the strips 33 to 38. Consider an acoustic surface wave coming from the end 22 of the cavity. This wave will be partially reflected back towards the end 22 of the cavity with a substantially equal amplitude by all the strips 33 to 38. Compared with the reflected energy of this wave from the strip 33, the reflected energy of this wave from the strips 34, 35, 36, 37 and 38 will travel an extra distance of respectively $\lambda$, $2\lambda$, $3.5\lambda$, $4.5\lambda$ and $5.5\lambda$, that is to say twice the spacing between that strip and the strip 33 in each case. Thus the reflected energy from the pair of strips 33 and 36 is in anti-phase, the reflected energy from the pair of strips 34 and 37 is in anti-phase, and the reflected energy from the pair of strips 35 and 38 is in anti-phase. The three quarters of a wavelength separation between the strips 35 and 36 thus results in the reflected energy from the array of strips 33, 34 and 35 cancelling with the reflected energy from the similar array of strips 36, 37 and 38 and hence the reflected acoustic surface wave energy from the interdigital transducer is suppressed.

The multiply reflected acoustic surface waves travelling between the ends 22, 23 of the cavity also cause currents to circulate along the bus bars 31 and 32 to the strips 33 to 38 which result in re-radiation of acoustic surface waves by the strips 33 to 38. Since all the strips 33 to 38 couple with equal strength to the standing wave 21 by virtue of their position mid-way between a node N and an adjacent antinode AN of that standing wave, the resulting re-radiation of acoustic surface waves by the strips 33 to 38 will be of the same amplitude for all the strips 33 to 38. In the same way as for partially reflected surface wave energy, the three quarters of a wavelength separation between the strips 35 and 36 results in the re-radiated energy from the array of strips 33, 34 and 35 cancelling with the re-radiated energy from the similar array of strips 36, 37 and 38 and hence the re-radiated acoustic surface wave energy from the interdigital transducer is suppressed.

The suppression of reflected and re-radiated energy as explained above will be equally effective if the centre-to-centre spacing between the strips 33, 34, 35 and between the strips 36, 37, 38 is not a half wavelength but an odd integral multiple of half a wavelength, i.e. if the transducer couples to the standing wave at an odd harmonic of its fundamental frequency. The suppression of reflected and re-radiated energy will also be equally effective if the separation between the array of strips 33, 34, 35 and the similar array of strips 36, 37, 38 is not three quarters of a wavelength as shown in FIG. 3 but is a quarter wavelength or any other odd integral multiple of a quarter wavelength. The suppression of reflected and re-radiated energy as explained above will also be equally effective if the point mid-way between the two arrays is not at the centre of the cavity as shown in FIG. 3 but is displaced from the centre of the cavity by half a wavelength or an integral multiple of half a wavelength. Furthermore, FIG. 3 shows a node N present at the centre I—I of the cavity due to the length of the cavity being an even number of half wavelengths at the frequency $f_o$. If the length of the cavity is an odd number of half wavelengths at the frequency $f_o$ so that an antinode AN is present at the centre I—I of the cavity, then all the strips 33 to 38 of the interdigital transducers as shown in FIG. 3 will nevertheless still be mid-way between a node N and an adjacent antinode AN of the acoustic surface standing wave in the cavity and the suppression of reflected and re-radiated energy as explained above will be equally effective.

The arrangement of an interdigital transducer in a resonant cavity as described above with reference to FIG. 3 is equally applicable to the input transducer 15 and the output transducer 16 of the filter shown in FIG. 1. If the array 14 shown in FIG. 1 for coupling the two resonators has its discrete parallel conductive strips at a centre-to-centre spacing of half a wavelength at the frequency $f_o$ of an acoustic surface standing wave in each of the two resonators, then these strips will partially reflect the multiply reflected acoustic surface waves travelling between the ends of each resonator cavity in the same way as the transducer 15 and the transducer 16. However, there will be no re-radiation of acoustic surface wave energy since the strips of the array 14 are not connected by bus bars. If the bus bars 31 and 32 are considered absent from FIG. 3, then the arrangement of the two similar arrays of strips 33, 34, 35 and 36, 37, 38 can be considered as forming that part of a coupling array 14 which extends into each of the two resonators of the filter shown in FIG. 1, and the suppression of reflected energy as explained above for the interdigital transducer will be equally effective for this arrangement of the coupling array 14. FIG. 4 illustrates a pair of coupled resonators having transducers 15 and 16 and coupling arrays 14' and 14" arranged in accordance with the invention. The coupling arrays are interconnected by means of electric leads 39, shown as dashed lines. Alternatively, a single array of conductive strips extending between the resonators, similar to the array 14 in FIG. 1 but with the spacing of the strips in accordance with the invention, could be used instead of electric leads 39 to provide energy coupling between the two resonator devices. An alternative arrangement of a coupled resonator filter to that shown in FIG. 1 can be one in which the input and output transducers 15 and 16 are outside their respective resonators so that they launch into and receive from their respective resonators by transmission underneath one of the grating reflectors 10, 11, 12 or 13. In this case the arrangement of two similar arrays of strips 33, 34, 35 and 36, 37, 38 as shown in FIG. 3 would only be applicable to the coupling array 14. A further alternative arrangement of a coupled resonator filter to that shown in FIG. 1 can be one in which an interdigital transducer is used instead of the array 14 for coupling the two resonators. In this case, the arrangement of FIG. 3 for suppressing reflected and re-radiated energy would also be applicable to that transducer used for coupling the two resonators.

An acoustic surface wave device having an acoustic surface wave resonator and an interdigital input or output transducer within the cavity of the resonator has applications other than to the coupled resonator filter shown in FIG. 1, for example as a frequency control element in an oscillator. The arrangement of the interdigital transducer as shown in FIG. 3 for the suppression of reflected and re-radiated energy is also advantageous in these other applications.

An acoustic surface wave device having an acoustic surface wave resonator may have means for coupling with acoustic surface wave energy in the resonator, which coupling means consists of or includes parallel conductive strips transverse to the length of the resonator cavity and between the pair of reflectors forming that cavity, provided for a purpose other than an input transducer, an output transducer or means for coupling two resonators. For example, an interdigital transducer may be provided in the resonator for the purpose of affecting the velocity of acoustic surface waves in the resonator and hence the frequency of the standing wave in the resonator. That is to say that removal of a part of the transducer or a change in an external circuit connected to the transducer is a possible means of frequency trimming the resonator. Such a frequency trimming interdigital transducer can also be arranged in the manner shown in FIG. 3 for the suppression of reflected and re-radiated energy.

For all the types of coupling means indicated in the above paragraph, which coupling means consist of or include parallel conductive strips transverse to the length of the resonator cavity and located between the pair of reflectors forming that cavity, the number of strips provided depends on the strength of coupling to the standing wave in the resonator which is required for the function of that coupling means. There is a limit on the effectiveness of the suppression of reflected energy, and also re-radiated energy if present, by the arrangement of the strips in two similar arrays as shown in FIG. 3 if the number of strips in the two arrays is too large. This is for the two reasons which will now be discussed.

Firstly, it has been assumed in the explanation of the arrangement of FIG. 3 that an acoustic surface wave coming from the end 22 of the cavity will be partially reflected back towards the end 22 of the cavity with a substantially equal amplitude by all of the strips 33 to 38. In fact, the wave coming from the end 22 of the cavity will be slightly attenuated as it passes under each of the electrodes 33 to 38. If the number of strips in each of the two arrays is sufficiently large, then this attenuation will result in the reflected energy from the two arrays being of significantly different amplitude, even though in anti-phase, and so the reflected energy will be incompletely suppressed to a significant degree. This limitation can be overcome by arranging the strips of the coupling means to form two or more pairs of similar arrays, with the two arrays of each pair arranged as shown in FIG. 3. The number of strips in each pair will be sufficiently small to achieve substantially complete suppression of reflected energy, and also re-radiated energy if present.

Secondly, it has beeen assumed in the explanation of the arrangement of FIG. 3 that the resonator has a response only at a single frequency, that is to say the frequency $f_o$ of the standing wave shown, which is also the frequency for which the strips 33 to 38 have a centre-to-centre spacing of half a wavelength $\lambda/2$. In fact the reflectors of the resonator reflect with high efficiency over a narrow range of frequencies. The resonator thus has a band-pass amplitude-frequency response over this narrow range of frequencies centred on the frequency $f_o$, and the coupling means constituted by the strips 33 to 38 operates over this range of frequencies. Assuming an equal amplitude of reflection from each of the strips 33 to 38, then the path difference for reflected energy is $3.5\lambda$ at the frequency $f_o$ between the two strips of each of the pairs of strips 33 and 36, 34 and 37, and 35 and 38. At a frequency other than the frequency $f_o$, the path difference between the two strips of each of these pairs will no longer be an odd integral multiple of half a wavelength. Thus the reflected energy, and also any re-radiated energy if present, from the two strips of each pair will no longer be exactly in anti-phase and the suppression of reflected energy, and also re-radiated energy if present, will not be complete at that other frequency. For the arrangement shown in FIG. 3, if this other frequency is 1 part in 7 different from the frequency $f_o$, then the reflected energy from the two strips of each pair will have a path difference of 3 or 4 wavelengths and so will be in phase. There is thus a frequency bandwidth over which the suppression of reflected energy, and also re-radiated energy if present, is effective and this bandwidth becomes smaller as the number of strips in each array becomes larger. For example, for a coupling means having 40 strips in each array, this bandwidth limitation means that the suppression of reflected energy will be by a factor of 100 in power for a relative bandwidth of 0.2 percent. We consider that the coupling means would not usually be required to have a number of strips greater than 80, and in this case the 0.2 per cent frequency bandwidth for a satisfactory reduction in power of reflected energy by a factor of 100 is greater than the bandwidth of the amplitude-frequency response of a typical resonator. However, if necessary, the bandwidth over which the coupling means has a given degree of suppression of reflected energy, and also possibly re-radiated energy if present, can be increased for a given number of strips in the coupling means by arranging the strips of the coupling means to form two or more pairs of similar arrays, with the two arrays of each pair arranged as shown in FIG. 3. The number of strips in each pair will be sufficiently small to achieve the given degree of suppression of reflected energy, and also re-radiated energy if present, over a sufficiently large bandwidth of frequencies.

Finally, it should be mentioned that in the case where the reflectors which form the resonant cavity of the resonator are each constituted by an array of discrete reflecting elements arranged one behind the other, for example, grooves or conducting strips, then variations caused by the fabrication process in the depth of the grooves or the width or thickness of the conducting strips will affect the velocity of acoustic surface waves uner these grooves or strips. This will affect the effective velocity of acoustic surface waves within a cavity of given length and hence the frequency of an acoustic surface standing wave formed in that cavity. If, for this or any other reason, a cavity of given length supports an acoustic surface standing wave at a frequency other than the frequency for which the spacing of the strips in each array of the coupling means is half a wavelength or an odd integral multiple of half a wavelength, then the suppression of reflected, and also possibly re-radiated, energy by the arrangement of the coupling means shown in FIG. 3 will still be effective if each strip of the coupling means is still approximately mid-way between a node and an adjacent antinode of the standing wave at that other frequency. This will be the case for a range of frequencies of the standing wave, a range of the number of strips in the coupling means and a range of positions of the coupling means with respect to the centre of the resonant cavity.

What is claimed is:

1. An acoustic surface wave resonator device comprising, a substrate having a surface layer of piezoelectric material, a pair of spaced apart reflectors on the piezoelectric surface forming a resonant cavity capable of supporting an acoustic surface standing wave at or near a predetermined frequency, and means for coupling with acoustic surface standing wave energy in the resonator, the coupling means including two similar arrays of parallel conductive strips on the piezoelectric surface transverse to the length of the cavity and located between the pair of reflectors, the strips of each array having a centre-to-centre spacing of half a wavelength or an odd integral multiple of half a wavelength of acoustic surface waves at said predetermined frequency, the spacing between the two arrays being a quarter wavelength or an odd integral multiple of a quarter wavelength of acoustic surface waves at said predetermined frequency, and a point mid-way between the two arrays being at the centre of the resonant cavity or displaced from the centre of the resonant cavity by half a wavelength or an integral multiple of a half wavelength of acoustic surface waves at said predetermined frequency.

2. An acoustic surface wave resonator device as claimed in claim 1 wherein said coupling means comprises an interdigital transducer within the cavity.

3. An electrical filter comprising two acoustic surface wave resonator devices as claimed in claim 2, in which said interdigital transducer in one of the resonator devices forms input transducing means arranged to launch acoustic surface wave energy into the resonator of that device which thereby forms an acoustic surface standing wave therein, means for coupling the two resonator devices whereby an acoustic surface standing wave is formed in the other resonator device, and in which said interdigital transducer in the other device forms an output transducing means arranged to receive acoustic surface wave energy from the other resonator device.

4. A filter as claimed in claim 3, in which the means for coupling the two reasonator devices comprises electrical coupling means including first and second arrays of discrete parallel conducting strips electrically insulated from each other, the first and second arrays of discrete strips being located in the one and the other resonator devices respectively and being arranged to transfer electrical energy from the first array of discrete strips to the second array of discrete strips, whereby part of the acoustic surface wave energy across the first array of discrete strips in the one resonator device is transferred to be relaunched as acoustic surface wave energy by the second array of discrete strips in the other resonator device.

5. A filter as claimed in claim 3 wherein said means for coupling the two resonator devices comprise a single array of discrete parallel conductive strips electrically insulated from one another and extending between the two resonator devices whereby a part of the acoustic surface standing wave energy in the one resonator device is transferred to be relaunched as acoustic surface wave energy in the other resonator device.

6. An electrical filter comprising two acoustic surface wave resonator devices as claimed in claim 1, in which input transducing means are arranged to launch acoustic surface wave energy into one resonator device which thereby forms an acoustic surface standing wave therein, electrical means for coupling the two resonator devices whereby an acoustic surface standing wave is formed in the other resonator device, said electrical means including said coupling means in each device, said two similar arrays of conductive strips in one resonator device being arranged with said two similar arrays of conductive strips in the other resonator device so as to transfer electrical energy from the one to the other resonator device whereby part of the acoustic surface wave energy across the coupling means in the one resonator device is transferred to be relaunched as acoustic surface wave energy by the coupling means in the other resonator device, and output transducing means arranged to receive acoustic surface wave energy from the other resonator device.

7. A resonator device as claimed in claim 1 and further comprising a second acoustic surface wave resonator device coupled to the one resonator device via said coupling means to form an electric filter, an input transducer arranged to launch acoustic surface wave energy into the one resonator device which thereby forms an acoustic surface standing wave therein, said two similar arrays of parallel conductive strips extending between the one and the second resonator devices to transfer energy from the one to the second resonator device to be relaunched as acoustic surface wave energy in the second resonator device, the second resonator device including a pair of spaced apart reflectors forming a second resonant cavity and an output transducer coupled to receive acoustic surface wave energy from the second resonator device.

8. A resonator device as claimed in claim 1 in which each of the pair of reflectors in the device comprises an array of discrete reflecting elements arranged in parallel one behind the other and transverse to the length of the cavity.

9. A multi-resonator device comprising first and second acoustic surface wave resonator devices coupled together so as to transfer energy between the first and the second resonator devices, each of said resonator devices comprising, a substrate of piezoelectric material, a pair of aligned spaced apart reflectors coupled to the surface of the substrate and comprising an array of discrete parallel strips arranged to form a resonant cavity able to support an acoustic surface standing wave in the substrate at a predetermined frequency, and means including two similar arrays of parallel conductive strips arranged on the substrate transverse to the length of the cavity and located between the pair of reflectors for coupling with the acoustic standing wave energy in the substrate, the strips of each array having a center-to-center spacing of a half wavelength or an odd integral multiple thereof at said predetermined frequency, the two arrays being spaced apart a quarter wavelength or an odd integral multiple thereof at said predetermined frequency, a midpoint between the two arrays being located at the center of the resonant cavity or displaced therefrom by a half wavelength or an integral multiple thereof at said predetermined frequency.

10. A multi-resonator device sa claimed in claim 9 wherein said first and second resonator devices are coupled together by a coupling device for coupling energy between said first and second resonator devices and wherein said energy coupling means of each resonator device comprises an interdigital transducer.

11. A multi-resonator device as claimed in claim 10 wherein said coupling device comprises a single array of parallel conductive strips extending between said first and second resonator devices and transverse thereto, the strips thereof being spaced apart a half wavelength at said predetermined frequency.

12. A multi-resonator device as claimed in claim 10 wherein said coupling device comprises first and second arrays of parallel conductive strips located respectively within said first and second resonator devices, and electrical means coupling said first and second arrays of conductive strips.

13. A multi-resonator device as claimed in claim 9 wherein said two similar arrays of parallel conductive strips comprise the means for coupling the first and second resonator devices together so as to transfer energy therebetween, and first and second interdigital transducers coupled respectively to said first and second resonator devices.

14. A multi-resonator device as claimed in claim 9 wherein a single substrate forms the substrate on which each of said first and second resonator devices are located.

* * * * *